US012713865B2

(12) United States Patent
Honda

(10) Patent No.: US 12,713,865 B2
(45) Date of Patent: Aug. 18, 2026

(54) SUBSTRATE PROCESSING APPARATUS AND SUBSTRATE PROCESSING METHOD

(71) Applicant: Tokyo Electron Limited, Tokyo (JP)

(72) Inventor: Takumi Honda, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 243 days.

(21) Appl. No.: 18/722,860

(22) PCT Filed: Dec. 26, 2022

(86) PCT No.: PCT/JP2022/047875
§ 371 (c)(1),
(2) Date: Jun. 21, 2024

(87) PCT Pub. No.: WO2023/132286
PCT Pub. Date: Jul. 13, 2023

(65) Prior Publication Data

US 2025/0054782 A1 Feb. 13, 2025

(30) Foreign Application Priority Data

Jan. 4, 2022 (JP) ................................ 2022-000242

(51) Int. Cl.
*H10P 72/00* (2026.01)
*C23F 1/26* (2006.01)
*H10P 50/66* (2026.01)

(52) U.S. Cl.
CPC ............ *H10P 72/0422* (2026.01); *C23F 1/26* (2013.01); *H10P 50/667* (2026.01); *H10P 72/0604* (2026.01)

(58) Field of Classification Search
None
See application file for complete search history.

(56) References Cited

U.S. PATENT DOCUMENTS

2016/0351417 A1* 12/2016 Akeboshi .............. H10P 50/667
2020/0006094 A1* 1/2020 Yoshida .............. H10P 72/0426
(Continued)

FOREIGN PATENT DOCUMENTS

JP 2003-234307 A 8/2003

OTHER PUBLICATIONS

International Search Report and Written Opinion mailed on Mar. 14, 2023, received for PCT Application PCT/JP2022/047875, filed on Dec. 26, 2022, 8 pages including English Translation.

*Primary Examiner* — Binh X Tran
(74) *Attorney, Agent, or Firm* — XSENSUS LLP

(57) ABSTRACT

A substrate processing apparatus etches a molybdenum film of a substrate having a device structure that includes, in a multistage manner, multilayer films including the molybdenum film. A processing tank retains therein etchant including acetic acid, phosphoric acid, nitric acid, and water as components. A controller is configured to: based on concentrations of the components, an amount of the etchant, a preliminarily-set target amount of the etchant, and preliminarily-set target concentrations of the respective components; decide a discharging amount of the etchant from the processing tank, and replenishing amounts of acetic acid, phosphoric acid, and nitric acid to the processing tank; control an open/close valve to discharge the decided discharging amount of the etchant from the processing tank; and control a supply unit to replenish the processing tank with the decided replenishing amounts of acetic acid, phosphoric acid, and nitric acid.

8 Claims, 5 Drawing Sheets

(56) References Cited

U.S. PATENT DOCUMENTS

| | | | | |
|---|---|---|---|---|
| 2020/0279752 | A1* | 9/2020 | Honda | H10P 50/667 |
| 2021/0358773 | A1* | 11/2021 | Honda | H10P 50/667 |
| 2024/0295030 | A1* | 9/2024 | Kimura | C23F 1/16 |

* cited by examiner

SUBSTRATE PROCESSING APPARATUS AND SUBSTRATE PROCESSING METHOD

CROSS-REFERENCE TO RELATED APPLICATIONS

This application is national stage application of International Application No. PCT/JP2022/047875, filed on Dec. 26, 2022, which designates the United States, incorporated herein by reference, and which claims the benefit of priority from Japanese Patent Application No. 2022-000242, filed on Jan. 4, 2022, the entire contents of each are incorporated herein by reference.

FIELD

Exemplary embodiment disclosed herein relates to a substrate processing apparatus and a substrate processing method.

BACKGROUND

Conventionally, there has been known a technology for etching a tungsten film that is formed on a substrate such as a semiconductor wafer (hereinafter, may be referred to as wafer) (see Patent Literature 1).

CITATION LIST

Patent Literature

Patent Literature 1: Japanese Laid-open Patent Publication No. 2003-234307

SUMMARY

A substrate processing apparatus according to one aspect of an embodiment, which etch a molybdenum film of a substrate having a device structure that includes, in a multistage manner, multilayer films including the molybdenum film, includes a processing tank, a supply unit, an open/close valve, a concentration measuring unit, a liquid amount measuring unit, and a controller. The processing tank retains therein etchant including acetic acid, phosphoric acid, nitric acid, and water as components. The supply unit supplies acetic acid, phosphoric acid, nitric acid, and water individually or as the etchant to the processing tank. The open/close valve opens/closes a liquid discharging passage of the processing tank. The concentration measuring unit measures a concentration for each of the components of the etchant retained in the processing tank. The liquid amount measuring unit measures an amount of the etchant retained in the processing tank. The controller controls the open/close valve and the supply unit to execute a discharging and replenishing process including: discharging a part of the etchant from the processing tank; and replenishing the processing tank with acetic acid, phosphoric acid, and nitric acid. In the discharging and replenishing process, the controller is configured to: based on concentrations of the respective components measured by the concentration measuring unit, an amount of the etchant measured by the liquid amount measuring unit, a preliminarily-set target amount of the etchant, and preliminarily-set target concentrations of the respective components; decide a discharging amount of the etchant from the processing tank, and replenishing amounts of acetic acid, phosphoric acid, and nitric acid to the processing tank; control the open/close valve to discharge the decided discharging amount of the etchant from the processing tank; and control the supply unit to replenish the processing tank with the decided replenishing amounts of acetic acid, phosphoric acid, and nitric acid.

BRIEF DESCRIPTION OF DRAWINGS

FIG. 3 is a graph illustrating time-dependent changes in an etching rate of etchant with respect to a molybdenum film.

FIG. 4 is a graph illustrating time-dependent changes in a moisture concentration and an acetic acid concentration of etchant.

FIG. 5 is a diagram illustrating a configuration of a substrate processing apparatus according to the embodiment.

DESCRIPTION OF EMBODIMENTS

Hereinafter, an exemplary embodiment of a substrate processing apparatus and a substrate processing method disclosed in the present application will be described in detail with reference to the accompanying drawings. In addition, the illustrative embodiment disclosed below is not intended to limit the present invention. Moreover, the embodiments may be arbitrarily combined in a consistent range of processing. In the following embodiments, the same elements are provided with the same reference symbol so as to omit duplicated explanation.

Furthermore, in the following embodiments, expressions of “constant”, “perpendicular”, “vertical”, and “parallel” are used in some cases; however, it is unnecessary that the expressions are strictly “constant”, “perpendicular”, “vertical”, and “parallel”. In other words, the above-mentioned expressions allow deviation such as manufacturing accuracy and placement accuracy.

<Substrate Processing>

Figure 1:
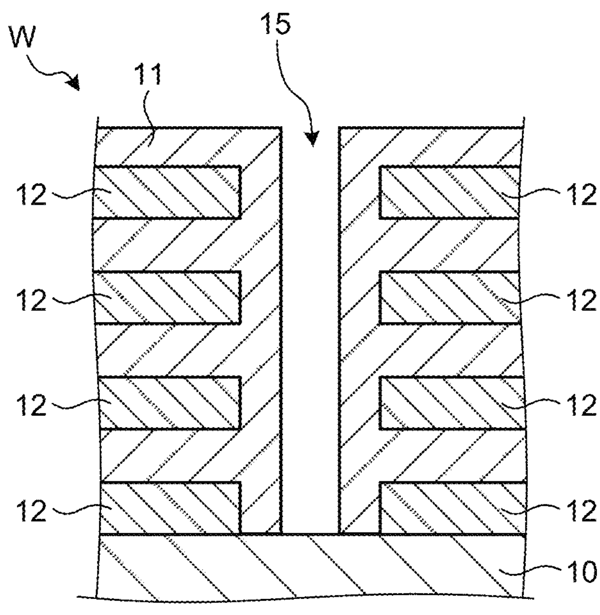
FIG. 1 is a diagram illustrating substrate processing according to an embodiment.
Figure 2:
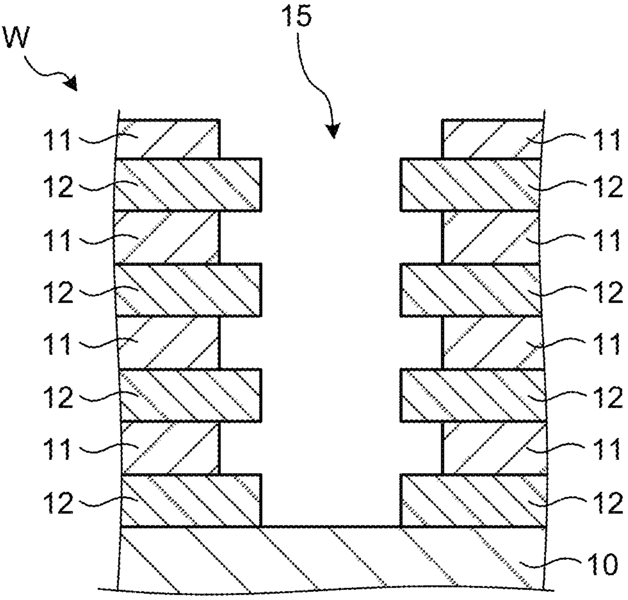
FIG. 2 is a diagram illustrating substrate processing according to the embodiment.

Details of substrate processing according to an embodiment will be explained with reference to FIG. 1 and FIG. 2. FIGS. 1 and 2 are diagrams illustrating substrate processing according to the embodiment.

As illustrated in FIG. 1, a semiconductor wafer (hereinafter, may be referred to as wafer W) subjected to substrate processing according to the embodiment has a device structure that includes, in a multistage manner, multilayer films including a molybdenum film.

For one example, the wafer W includes a molybdenum film 11 and a plurality of silicon oxide films 12 on a polysilicon film 10. The plurality of silicon oxide films 12 is formed such that a gap is interposed therebetween on the polysilicon film 10. The molybdenum film 11 is located in gaps between the silicon oxide films 12 so as to cover the plurality of silicon oxide films 12 as a whole.

As described above, a device structure of the wafer W according to the embodiment includes a multilayer film in which the molybdenum film 11 and the silicon oxide films 12 are laminated in a multistage manner. Note that the multilayer film may include a film other than the molybdenum film 11 and the silicon oxide film 12. For example, the multilayer film may include a titanium nitride film between the molybdenum film 11 and the silicon oxide film 12.

In the wafer W, a plurality of grooves 15 is formed through which etchant enters so as to etch the laminated molybdenum film 11. Note that in FIG. 1, the single groove 15 alone is illustrated.

The substrate processing according to the embodiment includes etching the molybdenum film 11 of the wafer W so as to expose a part (edge portion) of the silicon oxide films 12 from the molybdenum film 11 as illustrated in FIG. 2.

In etching the molybdenum film 11, etchant is used which includes acetic acid, phosphoric acid, nitric acid, and water as components. Herein, an inventor according to the present application found out that an etching rate of the etchant with respect to the molybdenum film 11 rose in accordance with passage of time. Moreover, the inventor according to the present application also found out that a cause of the above-mentioned was due to rise in a moisture concentration in the etchant.

Figures 3, 4:
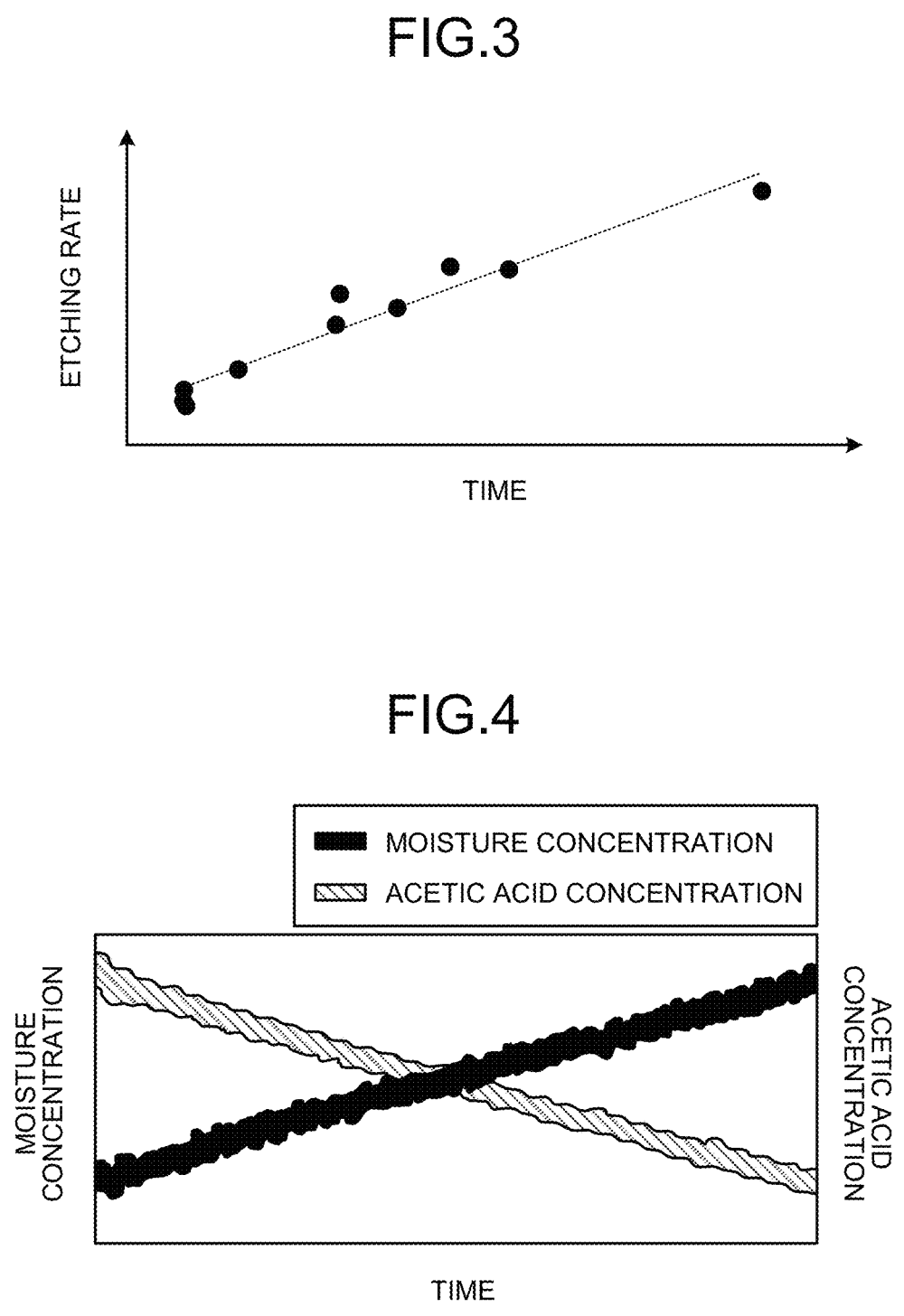

FIG. 3 is a graph illustrating time-dependent changes in an etching rate of etchant with respect to the molybdenum film 11. FIG. 4 is a graph illustrating time-dependent changes in a moisture concentration and an acetic acid concentration of the etchant. Note that a "time interval" described herein means an elapsed time interval from a time point at which etchant is adjusted to a desired concentration, for example. Moreover, a "time interval" described herein may be an elapsed time interval from a time point at which processing for the wafer W is started with the use of etchant whose concentration is adjusted to the desired one.

As illustrated in FIG. 3, it is found that an etching rate of etchant for the molybdenum film 11 rises in accordance with passage of time. As illustrated in FIG. 4, it is found that a moisture concentration of etchant increases in accordance with passage of time, and an acetic acid concentration of the etchant reduces in accordance with passage of time.

As described above, correlation was found between a rise in a moisture concentration of etchant and a rise in an etching rate of the etchant with respect to the molybdenum film 11. Furthermore, correlation was also found between a rise in a moisture concentration of etchant and a decrease in an acetic acid concentration of the etchant.

As a reason for such a result, the following is considered, for example. In other words, etching of the molybdenum film 11 proceeds by reaction between a molybdenum dioxide and water. Specifically, nitric acid in etchant reacts with molybdenum so as to generate molybdenum dioxide, and further the generated molybdenum dioxide reacts with water in the etchant so that the molybdenum dioxide solves (in other words, etched). Thus, it is considered that as a moisture concentration in etchant is higher, an etching rate of the molybdenum film 11 rises more.

Regarding correlation between a moisture concentration and an acetic acid concentration in etchant, the following two points are considered, for example. By vaporization of acetic acid in etchant, a moisture concentration in the etchant is considered to relatively rise. Acetic acid had moisture absorbency, and thus acetic acid in the etchant absorbed water in the atmosphere so that a moisture concentration in the etchant was considered to rise.

As described above, etchant according to the embodiment includes acetic acid so that a rise in a moisture concentration easily occurs, and in a case where the moisture concentration has risen, an etching rate with respect to the molybdenum film 11 also rises. Molybdenum corresponds to a base metal, and thus has a high ionization tendency to be relatively easily oxidized. Therefore, the molybdenum film 11 is more easily etched compared with a tungsten film, for example, and there presents possibility that a rise in an etching rate thereof causes increase in dispersion of an etching amount in a lamination direction, for example. Hence, it is desirable to reduce a rise in an etching rate as much as possible.

Therefore, in the substrate processing apparatus according to the embodiment, a rise in a moisture concentration of etchant is reduced so as to reduce a rise in an etching rate, in order to stabilize etching of the molybdenum film 11.

<Configuration of Substrate Processing Apparatus>

Figure 5:
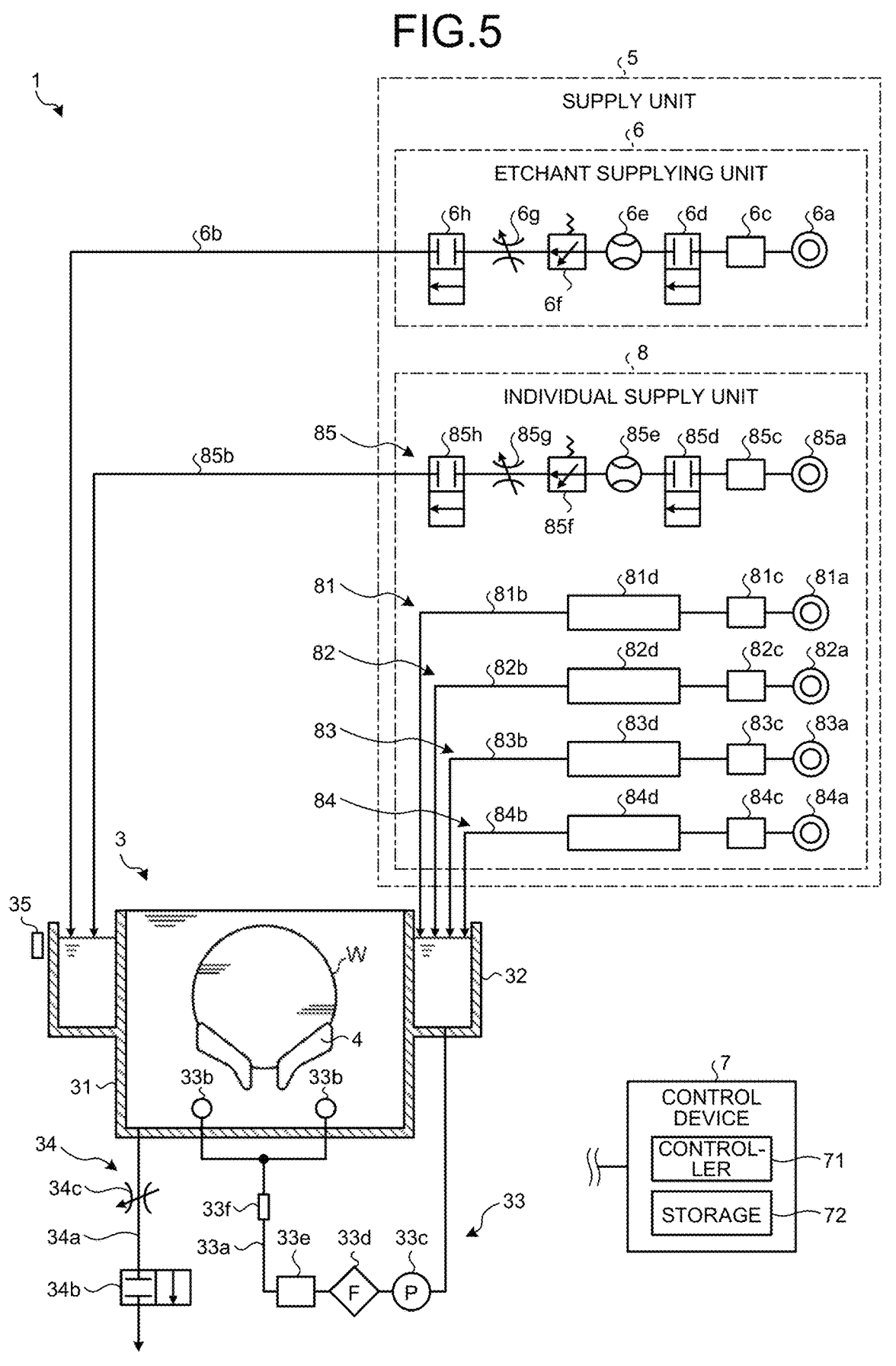

Next, a configuration of a substrate processing apparatus that executes the above-mentioned substrate processing will be explained with reference to FIG. 5. FIG. 5 is a diagram illustrating a configuration of a substrate processing apparatus according to the embodiment.

As illustrated in FIG. 5, a substrate processing apparatus 1 includes a processing tank 3, a holding unit 4, and a supply unit 5. The substrate processing apparatus 1 further includes a control device 7.

The processing tank 3 includes an inner tank 31, an outer tank 32, a circulation unit 33, and a drainage unit 34. An upper portion of the inner tank 31 is opened, and the inner tank 31 retains etchant. The plurality of wafer W is dipped in the inner tank 31. The outer tank 32 is arranged around an upper portion of the inner tank 31. An upper portion of the outer tank 32 is opened so as to retain etchant that has overflown from the inner tank 31.

The outer tank 32 is provided with a liquid level sensor 35. The liquid level sensor 35 measures a height of a liquid surface of etchant that is retained in the outer tank 32. As the above-mentioned liquid level sensor 35, a differential pressure type level sensor may be used. A controller 71 to be mentioned later detects a liquid amount of etchant retained in the processing tank 3 on the basis of a liquid level of the outer tank 32, which is measured by the liquid level sensor 35.

In other words, inner parts of the inner tank 31 and a circulation path 33*a* to be mentioned later are filled with etchant. Thus, a liquid amount of etchant in the inner tank 31 and the circulation path 33*a* is considered to be always constant. Thus, by adding an already-known value of a liquid amount of the inner tank 31 and the circulation path 33*a* to a liquid amount of the outer tank 32 which is grasped from a liquid level of etchant in the outer tank 32, a liquid amount of etchant in whole of the processing tank 3 can be obtained.

As described above, the liquid level sensor 35 corresponds to one example of a liquid amount measuring unit configured to measure an amount of etchant that is retained in the processing tank 3.

The circulation unit 33 circulates etchant between the inner tank 31 and the outer tank 32. The circulation unit 33 includes the circulation path 33*a*, a nozzle 33*b*, a pump 33*c*, a filter 33*d*, a temperature regulating unit 33*e*, and a concentration sensor 33*f*. The circulation path 33*a* connects the outer tank 32 and the inner tank 31 to each other. One end of the circulation path 33*a* is connected to the outer tank 32, and another end of the circulation path 33*a* is connected to the nozzle 33*b* that is arranged in the inner tank 31.

The pump 33*c*, the filter 33*d*, the temperature regulating unit 33*e*, and the concentration sensor 33*f* are provided on the circulation path 33*a*. The pump 33*c* delivers etchant in the outer tank 32 to the circulation path 33*a*. The filter 33*d* removes impurities from etchant flowing through the circulation path 33*a*. The temperature regulating unit 33*e* is an electronic constant temperature chamber, for example, and adjusts a temperature of etchant flowing through the circulation path 33*a* to a temperature that is equal to or more than 10° C. and equal to or less than 40° C. Preferably, the temperature regulating unit 33*e* adjusts a temperature of etchant to a temperature that is equal to or more than 10° C. and equal to or less than the normal temperature. The pump 33*c* and the temperature regulating unit 33*e* are controlled by the controller 71.

The concentration sensor 33*f* measures concentrations of components in etchant that is circulating through the circulation path 33*a*. In other words, the concentration sensor 33*f* measures an acetic acid concentration, a phosphoric acid concentration, a nitric acid concentration, and a moisture concentration in etchant. Measurement result by the concentration sensor 33*f* is transmitted to the controller 71 to be mentioned later.

As described above, the concentration sensor 33*f* corresponds to one example of a concentration measuring unit configured to measure concentrations of components in etchant that is retained in the processing tank 3.

The circulation unit 33 delivers etchant from the outer tank 32 into the inner tank 31 via the circulation path 33*a*. The etchant delivered into the inner tank 31 overflows from the inner tank 31 so as to flow again into the outer tank 32. As described above, etchant circulates between the inner tank 31 and the outer tank 32.

As described above, molybdenum is comparatively easily etched, thus in a case where a temperature of etchant is raised, there presents possibility that a etching speed of the molybdenum film 11 becomes excessively fast so that dispersion of an etching amount in a lamination direction of the molybdenum film 11 is large. Thus, in the substrate processing apparatus 1, etchant is used, whose temperature is reduced to equal to or more than 10° C. and equal to or less than 40° C., preferably equal to or more than 10° C. and equal to or less than the room temperature. Reason for the temperature of equal to or more than 10° C. is for preventing freezing of acetic acid (whose melting temperature is about 17° C.).

The drainage unit 34 includes a liquid discharging passage 34*a*, an open/close valve 34*b*, and a flow volume adjusting valve 34*c*. The liquid discharging passage 34*a* is connected with a bottom surface of the inner tank 31, for example. Etchant retained in the processing tank 3 is discharged to the outside via the liquid discharging passage 34*a*. The open/close valve 34*b* opens/closes the liquid discharging passage 34*a*. The flow volume adjusting valve 34*c* is a needle valve, for example, and adjusts a flow volume of etchant to be discharged from the liquid discharging passage 34*a*.

As described above, the flow volume adjusting valve 34*c* is provided to the liquid discharging passage 34*a*, and thus a drainage speed can be adjusted. Specifically, a drainage speed can be reduced. Thus, in a case where discharging a part of etchant retained in the processing tank 3 in a discharging and replenishing process to be mentioned later, it is possible to control an amount of the etchant that is accurately discharged from the processing tank 3.

The holding unit 4 holds the plurality of wafers W in a state where the elected wafers W are aligned back and forth. The holding unit 4 is connected with a not-illustrated turn/lift mechanism, and further is capable of moving the held wafers W between a processing position in the inner tank 31 and a waiting position above the inner tank 31.

The supply unit 5 includes an etchant supplying unit 6 and an individual supply unit 8. The etchant supplying unit 6 supplies etchant to the processing tank 3. The individual supply unit 8 individually supplies components (acetic acid, phosphoric acid, nitric acid, and water) of etchant to the processing tank 3.

The etchant supplying unit 6 includes an etchant supply source 6*a*, a supply route 6*b*, a temperature regulating unit 6*c*, a first open/close valve 6*d*, a flow meter 6*e*, a constant-pressure valve 6*f*, a flow volume adjusting valve 6*g*, and a second open/close valve 6*h*.

The supply route 6*b* connects the etchant supply source 6*a* and the outer tank 32 of the processing tank 3 to each other. The temperature regulating unit 6*c*, the first open/close valve 6*d*, the flow meter 6*e*, the constant-pressure valve 6*f*, the flow volume adjusting valve 6*g*, and the second open/close valve 6*h* are connected to the supply route 6*b*. In the embodiment, the temperature regulating unit 6*c*, the first open/close valve 6*d*, the flow meter 6*e*, the constant-pressure valve 6*f*, the flow volume adjusting valve 6*g*, and the second open/close valve 6*h* are arranged in this order from an upper flow side (side close to etchant supply source 6*a*).

The temperature regulating unit 6*c* is an electronic constant temperature chamber, for example, and adjusts a temperature of etchant flowing through the supply route 6*b* to a temperature that is equal to or more than 10° C. and equal to or less than 40° C. Preferably, the temperature regulating unit 6*c* adjusts a temperature of etchant to a temperature that is equal to or more than 10° C. and equal to or less than the normal temperature.

The first open/close valve 6*d* and the second open/close valve 6*h* open/close the supply route 6*b*. The flow meter 6*e* measures a flow volume of etchant flowing through the supply route 6*b*. The constant-pressure valve 6*f* adjusts a pressure on a downstream side from the constant-pressure valve 6*f* on the supply route 6*b*. The flow volume adjusting valve 6*g* adjusts a flow volume of etchant flowing through the supply route 6*b*.

The temperature regulating unit 6*c*, the first open/close valve 6*d*, the flow volume adjusting valve 6*g*, and the second open/close valve 6*h* are controlled by the controller 71. For example, the controller 71 controls the flow volume adjusting valve 6*g* on the basis of a flow volume of etchant, which is measured by the flow meter 6*e*, so as to adjust a flow volume of the etchant flowing through the supply route 6*b* to a preliminarily-set flow volume. Thus, in a discharging and replenishing process to be mentioned later, the substrate processing apparatus 1 is capable of accurately adjusting a replenishing amount of etchant.

Next, the individual supply unit 8 will be explained. The individual supply unit 8 includes a first acetic acid supply unit 81, a phosphoric acid supplying unit 82, a nitric acid supplying unit 83, a water supplying unit 84, and a second acetic acid supplying unit 85.

The first acetic acid supply unit 81 includes an acetic acid supply source 81*a*, a supply route 81*b*, a temperature regulating unit 81*c*, and a constant volume pump 81*d*.

The supply route 81*b* connects the acetic acid supply source 81*a* and the outer tank 32 to each other. The temperature regulating unit 81*c* is an electronic constant temperature chamber, for example, and adjusts a temperature of acetic acid aqueous solution flowing through the supply route 81*b* to a temperature that is equal to or more than 10°

C. and equal to or less than 40° C. Preferably, the temperature regulating unit 81*c* adjusts a temperature of acetic acid aqueous solution to a temperature that is equal to or more than 10° C. and equal to or less than the normal temperature. The constant volume pump 81*d* delivers a constant amount of acetic acid aqueous solution to the supply route 81*b* located on a lower flow than the constant volume pump 81*d*.

The phosphoric acid supplying unit 82 includes a phosphoric acid supply source 82*a*, a supply route 82*b*, a temperature regulating unit 82*c*, and a constant volume pump 82*d*.

The supply route 82*b* connects the phosphoric acid supply source 82*a* and the outer tank 32 to each other. The temperature regulating unit 82*c* is an electronic constant temperature chamber, for example, and adjusts a temperature of phosphoric acid aqueous solution flowing through the supply route 82*b* to a temperature that is equal to or more than 10° C. and equal to or less than 40° C. Preferably, the temperature regulating unit 82*c* adjusts a temperature of phosphoric acid aqueous solution to a temperature that is equal to or more than 10° C. and equal to or less than the normal temperature. The constant volume pump 82*d* delivers a constant amount of phosphoric acid aqueous solution to the supply route 82*b* located on a lower flow than the constant volume pump 82*d*.

The nitric acid supplying unit 83 includes a nitric acid supply source 83*a*, a supply route 83*b*, a temperature regulating unit 83*c*, and a constant volume pump 83*d*.

The supply route 83*b* connects the nitric acid supply source 83*a* and the outer tank 32 to each other. The temperature regulating unit 83*c* is an electronic constant temperature chamber, for example, and adjusts a temperature of nitric acid aqueous solution flowing through the supply route 83*b* to a temperature that is equal to or more than 10° C. and equal to or less than 40° C. Preferably, the temperature regulating unit 83*c* adjusts a temperature of nitric acid aqueous solution to a temperature that is equal to or more than 10° C. and equal to or less than the normal temperature. The constant volume pump 83*d* delivers a constant amount of nitric acid aqueous solution to the supply route 83*b* located on a lower flow than the constant volume pump 83*d*.

The water supplying unit 84 includes a water supply source 84*a*, a supply route 84*b*, a temperature regulating unit 84*c*, and a constant volume pump 84*d*.

The supply route 84*b* connects the water supply source 84*a* and the outer tank 32 to each other. The temperature regulating unit 84*c* is an electronic constant temperature chamber, for example, and adjusts a temperature of water (for example, deionized water) flowing through the supply route 84*b* to a temperature that is equal to or more than 10° C. and equal to or less than 40° C. Preferably, the temperature regulating unit 84*c* adjusts a temperature of water to a temperature that is equal to or more than 10° C. and equal to or less than the normal temperature. The constant volume pump 84*d* delivers a constant amount of water to the supply route 84*b* located on a lower flow than the constant volume pump 84*d*.

The second acetic acid supplying unit 85 includes an acetic acid supply source 85*a*, a supply route 85*b*, a temperature regulating unit 85*c*, a first open/close valve 85*d*, a flowmeter 85*e*, a constant-pressure valve 85*f*, a flow volume adjusting valve 85*g*, and a second open/close valve 85*h*.

The supply route 85*b* connects the acetic acid supply source 85*a* and the outer tank 32 of the processing tank 3 to each other. The temperature regulating unit 85*c*, the first open/close valve 85*d*, the flowmeter 85*e*, the constant-pressure valve 85*f*, the flow volume adjusting valve 85*g*, and the second open/close valve 85*h* are connected to the supply route 85*b*. In the embodiment, the temperature regulating unit 85*c*, the first open/close valve 85*d*, the flowmeter 85*e*, the constant-pressure valve 85*f*, the flow volume adjusting valve 85*g*, and the second open/close valve 85*h* are arranged in this order from an upper flow side (side close to acetic acid supply source 85*a*).

The temperature regulating unit 85*c* is an electronic constant temperature chamber, for example, and adjusts a temperature of acetic acid aqueous solution flowing through the supply route 85*b* to a temperature that is equal to or more than 10° C. and equal to or less than 40° C. Preferably, the temperature regulating unit 85*c* adjusts a temperature of acetic acid aqueous solution to a temperature that is equal to or more than 10° C. and equal to or less than the normal temperature.

The first open/close valve 85*d* and the second open/close valve 85*h* open/close the supply route 85*b*. The flowmeter 85*e* measures a flow volume of acetic acid aqueous solution flowing through the supply route 85*b*. The constant-pressure valve 85*f* adjusts a pressure on a downstream side from the constant-pressure valve 85*f* on the supply route 85*b*. The flow volume adjusting valve 85*g* adjusts a flow volume of acetic acid aqueous solution flowing through the supply route 85*b*.

The temperature regulating unit 85*c*, the first open/close valve 85*d*, the flow volume adjusting valve 85*g*, and the second open/close valve 85*h* are controlled by the controller 71. For example, the controller 71 controls the flow volume adjusting valve 85*g* on the basis of a flow volume of acetic acid aqueous solution, which is measured by the flowmeter 85*e*, and further adjusts a flow volume of acetic acid aqueous solution flowing through the supply route 85*b* to a preliminarily-set flow volume. Thus, in a discharging and replenishing process to be mentioned later, the substrate processing apparatus 1 is capable of accurately adjusting a replenishing amount of acetic acid aqueous solution.

A flow volume of acetic acid aqueous solution supplied from the second acetic acid supplying unit 85 is larger than a flow volume of acetic acid aqueous solution supplied from the first acetic acid supply unit 81.

A content of acetic acid in etchant is larger than those of other components. Specifically, a content of acetic acid in etchant is equal to or more than 50%. On the other hand, the substrate processing apparatus 1 includes, in addition to the first acetic acid supply unit 81, the second acetic acid supplying unit 85 whose supply amount is larger than that of the first acetic acid supply unit 81, so that it is possible to reduce a case where a time interval needed for replenishment of acetic acid becomes a bottleneck of a processing time interval in the discharging and replenishing process. In other words, it is possible to shorten a time interval needed for the discharging and replenishing process.

The substrate processing apparatus 1 further includes the control device 7. The control device 7 controls operation of each unit in the substrate processing apparatus 1. The control device 7 is a computer, for example, and includes the controller 71 and a storage 72.

The controller 71 is a controller. Various programs stored in a storage device of the control device 7 are executed while using a RAM as a work region by, for example, a Central Processing Unit (CPU), a Micro Processing Unit (MPU), among other things so as to realize the controller 71. The controller 71 may be realized by an integrated circuit such as an Application Specific Integrated Circuit (ASIC) and a Field Programmable Gate Array (FPGA).

The controller 71 includes a computer-readable storage medium. The storage medium stores therein the above-mentioned programs for controlling various processes to be executed in the substrate processing apparatus 1. The program is stored in a computer-readable storage medium, and further may be one that is installed in a storage medium of the controller 71 from another storage medium. As the computer-readable storage medium, for example, a hard disk (HD), a flexible disk (FD), a compact disc (CD), a magnet-optical disk (MO), a memory card, among other things may be used.

For example, the storage 72 is realized by a semiconductor memory element such as a Random Access Memory (RAM) and a Flash Memory, or a storage device such as a hard disk and an optical disk. The storage 72 stores therein set values (hereinafter, may be referred to as "target concentrations") of an acetic acid concentration, a phosphoric acid concentration, a nitric acid concentration, and a moisture concentration in etchant. The storage 72 stores therein physical property values regarding acetic acid aqueous solution, phosphoric acid aqueous solution, nitric acid aqueous solution, and water that are respectively supplied from the supply sources 81*a*, 82*a*, 83*a*, 84*a*, and 85*a*. Specifically, the storage 72 stores therein densities, concentrations, and the like of acetic acid aqueous solution, phosphoric acid aqueous solution, nitric acid aqueous solution, and water. Regarding a density of aqueous solution, both of a density of aqueous solution and a density excluding water (namely, when concentration is 100%) are stored. The storage 72 stores therein concentrations of components in etchant that is supplied from the etchant supplying unit 6.

<Specific Operation of Substrate Processing Apparatus>

Next, specific operations of the substrate processing apparatus 1 according to the embodiment will be explained with reference to FIG. 6 to FIG. 8. The outline of a liquid replacement process, a concentration adjusting process, and a discharging and replenishing process to be executed by the substrate processing apparatus 1 according to the embodiment will be explained with reference to FIG. 6.

Figure 6:
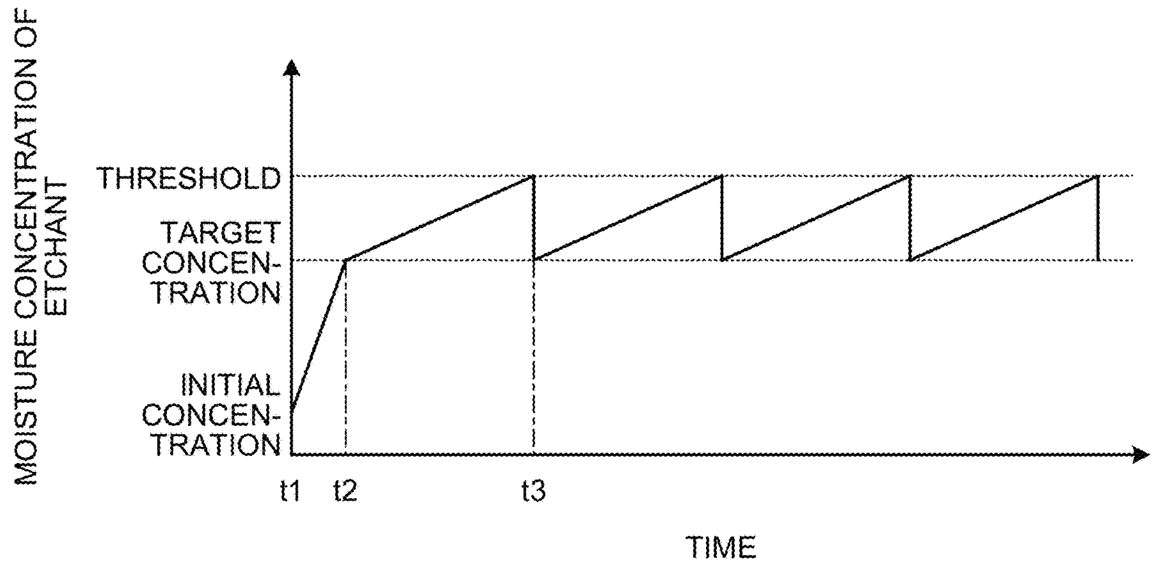
FIG. 6 is a diagram illustrating a liquid replacement process, a concentration adjusting process, and a discharging and replenishing process to be executed by the substrate processing apparatus according to the embodiment.

FIG. 6 is a diagram illustrating a liquid replacement process, a concentration adjusting process, and a discharging and replenishing process to be executed by the substrate processing apparatus 1 according to the embodiment. Note that a graph illustrated in FIG. 6 schematically indicates time-dependent changes in a moisture concentration of etchant retained in the processing tank 3.

As illustrated in FIG. 6, in the substrate processing apparatus 1, a liquid replacement process is first executed. In the liquid replacement process, the controller 71 causes the etchant supplying unit 6 to input etchant into the processing tank 3 in a vacant state. The etchant supplying unit 6 supplies etchant whose moisture concentration ("initial concentration" illustrated in FIG. 6) is lower than a target concentration to the processing tank 3 (time point t1).

Subsequently, in the substrate processing apparatus 1, there is executed a concentration adjusting process for adjusting a concentration of etchant that is retained in the processing tank 3. In the concentration adjusting process, the controller 71 causes the individual supply unit 8 to individually supply components of etchant to the processing tank 3 such that concentrations of components in the etchant become respective target concentrations. Thus, a moisture concentration of etchant retained in the processing tank 3 reaches a corresponding target concentration (time point t2). Next, the plurality of wafers W is dipped in the processing tank 3 so as to start an etching process of the molybdenum film 11 that is formed on a surface of each of the wafers W.

As described above, in etchant according to the embodiment, a moisture concentration rises over time. In a case where a moisture concentration exceeds a threshold, the controller 71 executes a discharging and replenishing process. In the discharging and replenishing process, the controller 71 discharges a part of etchant retained in the processing tank 3 from the processing tank 3, and further causes the supply unit 5 to replenish the processing tank 3 with acetic acid, phosphoric acid, and nitric acid. As described above, the processing tank 3 is replenished with acetic acid, phosphoric acid, and nitric acid while discharging a part of etchant retained in the processing tank 3 from the processing tank 3, so as to readjust concentrations of components of etchant including a moisture concentration to target concentrations (time point t3).

During a time interval until the next liquid replacement process is executed, the substrate processing apparatus 1 repeats the above-mentioned discharging and replenishing process every time when a moisture concentration exceeds a threshold. Thus, it is possible to reduce a rise in a moisture concentration of etchant. In other words, it is possible to reduce a rise in an etching rate of etchant with respect to the molybdenum film 11. Hence, in accordance with the substrate processing apparatus 1 according to the embodiment, it is possible to execute stably etching on the molybdenum film 11 that is formed on the wafer W.

Next, a specific processing procedure of the above-mentioned liquid replacement process, concentration adjusting process, and discharging and replenishing process will be explained with reference to FIG. 7 and FIG. 8. A procedure of the liquid replacement process and the concentration adjusting process will be explained with reference to FIG. 7. FIG. 7 is a flowchart illustrating a procedure for the liquid replacement process and the concentration adjusting process according to the embodiment.

Figure 7:
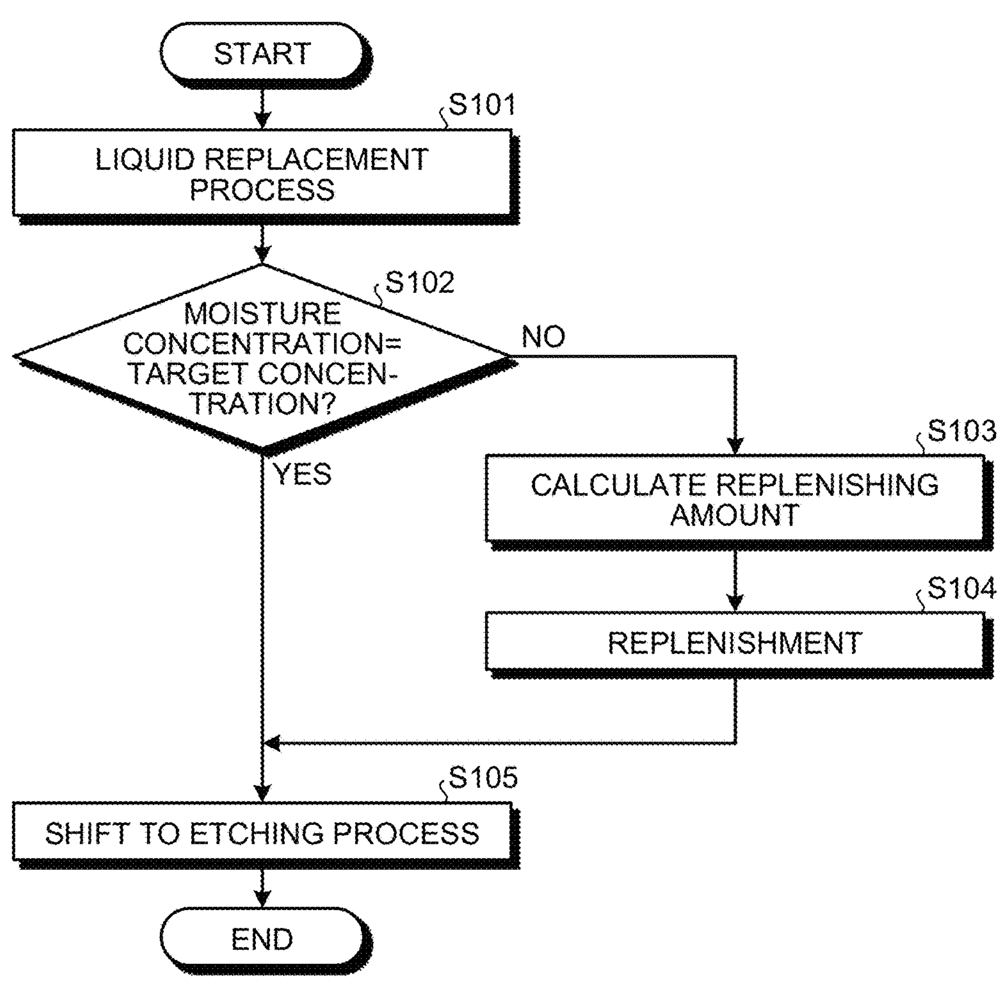
FIG. 7 is a flowchart illustrating a procedure for the liquid replacement process and the concentration adjusting process according to the embodiment.

As illustrated in FIG. 7, the controller 71 executes the liquid replacement process (Step S101). Specifically, the controller 71 opens the open/close valve 34*b* so as to discharge all etchant that is retained in the processing tank 3. Next, the controller 71 closes the open/close valve 34*b*. Note that in a case where etchant is not retained in the processing tank 3, the above-mentioned process is omitted.

Next, the controller 71 opens the first open/close valve 6*d* and the second open/close valve 6*h* of the etchant supplying unit 6 so as to input etchant from the etchant supplying unit 6 to the outer tank 32 of the processing tank 3. Etchant input to the outer tank 32 is supplied to the inner tank 31 via the circulation unit 33. Next, the inner tank 31 is filled with etchant and then etchant overflows from the inner tank 31, and thus the outer tank 32 is also retained with etchant. In accordance with a signal transmitted from the liquid level sensor 35, in a case where determining that a liquid surface of etchant in the outer tank 32 reaches a preliminarily-set position, the controller 71 closes the first open/close valve 6*d* and the second open/close valve 6*h* so as to stop inputting etchant to the processing tank 3.

The etchant supplying unit 6 is provided with the constant-pressure valve 6*f*, and thus a flow volume of etchant flowing through the supply route 6*b* is limited to a constant flow volume. In the liquid replacement process, the controller 71 controls the flow volume adjusting valve 6*g* on the basis of a flow volume of etchant measured by the flow meter 6*e* so as to adjust a flow volume of etchant flowing through the supply route 6*b* to a preliminarily-set flow volume. Thus, in the liquid replacement process, the substrate processing apparatus 1 is capable of appropriately controlling an input amount of etchant.

Next, the controller 71 determines whether or not a moisture concentration of etchant retained in the processing tank 3 is equal to a target concentration (Step S102). Specifically, the controller 71 acquires a moisture concentration of etchant retained in the processing tank 3 on the basis of a signal transmitted from the concentration sensor 33*f*. Next, the controller 71 compares the acquired moisture concentration and a target concentration of water which is stored in the storage 72 with each other so as to determine whether or not both of the concentrations coincide with each other.

In Step S102, in a case where a moisture concentration of etchant retained in the processing tank 3 is not equal to the target concentration (Step S102), the controller 71 shifts the processing to Step S103. Note that in the embodiment, a moisture concentration of etchant that is supplied from the etchant supplying unit 6 is lower than a target concentration. Thus, the processing is shifted from Step S101 to Step S103. Therefore, in such a case, the determination process in Step S102 may be omitted.

In Step S103, the controller 71 executes calculation of replenishing amounts of components.

The controller 71 acquires concentrations of components in etchant from measurement result of the concentration sensor 33*f*. The controller 71 acquires an amount of etchant retained in the processing tank 3 from measurement result of the liquid level sensor 35. The controller 71 acquires a target amount of etchant and target concentrations of components that are stored in the storage 72. The controller 71 decides replenishing amounts of acetic acid, phosphoric acid, nitric acid, and water on the basis of the above-mentioned acquired information.

Herein, details of a method for deciding replenishing amounts of acetic acid, phosphoric acid, nitric acid, and water will be explained.

Assume that a total amount of etchant just after liquid replacement processing is V (L). Note that V can be acquired from measurement result of the liquid level sensor 35. Moreover, assume that an amount of acetic acid included in the etchant just after liquid replacement processing is A (L), and an acetic acid concentration is a (wt %). Similarly thereto, assume that an amount of phosphoric acid included in the etchant just after liquid replacement processing is B (L), and an acetic acid concentration is b (wt %), an amount of nitric acid included in the etchant just after liquid replacement processing is C (L), and an acetic acid concentration is c (wt %), and an amount of water included in the etchant just after liquid replacement processing is D (L), and an acetic acid concentration is d (wt %). Note that the above-mentioned a to d can be acquired from measurement result of the concentration sensor 33*f*.

A total amount V (L) of etchant just after liquid replacement processing is indicated by the following formula (1).

$$A(L)+B(L)+C(L)+D(L)=V(L) \tag{1}$$

An acetic acid concentration a (wt %), a phosphoric acid concentration b (wt %), and a nitric acid concentration c (wt %) in etchant just after liquid replacement processing can be indicated by the following formulae (2) to (4).

$$\frac{D_{PA}*A}{D_{PA}*A+D_{PB}*B+D_{PC}*C+D_{PD}*D}\times \text{Total } conc(\text{wt }\%)=a(\text{wt }\%) \tag{2}$$

-continued $$\frac{D_{PB}*B}{D_{PA}*A+D_{PB}*B+D_{PC}*C+D_{PD}*D}\times \text{Total } conc(\text{wt }\%)=b(\text{wt }\%) \tag{3}$$

$$\frac{D_{PC}*C}{D_{PA}*A+D_{PB}*B+D_{PC}*C+D_{PD}*D}\times \text{Total } conc(\text{wt }\%)=c(\text{wt }\%) \tag{4}$$

Herein, "$D_{PA}$", "$D_{PB}$", "$D_{PC}$", and "$D_{PD}$" are respectively densities of acetic acid, phosphoric acid, nitric acid, and water that are preliminarily stored in the storage 72. The "Total count (wt %)" is a total value of an acetic acid concentration, a phosphoric acid concentration, a nitric acid concentration, and a moisture concentration.

The controller 71 solves simultaneous equations constituted of the above-mentioned formulae (1) to (4) so as to calculate unknown values of A to D, in other words, an acetic acid amount A (L), a phosphoric acid amount B (L), a nitric acid amount C (L), and a water amount D (L) that are included in etchant just after liquid replacement.

Next, assume that a total amount of etchant after the concentration adjusting process is V' (L). Moreover, assume that an amount of acetic acid included in etchant after the concentration adjusting process is A' (L) and an acetic acid concentration is a' (wt %). Similarly, an amount and a concentration of phosphoric acid included in etchant just after the concentration adjusting process are respectively B' (L) and b' (wt %), an amount and a concentration of nitric acid included in etchant just after the concentration adjusting process are respectively C' (L) and c' (wt %), and an amount and a concentration of water included in etchant just after the concentration adjusting process are respectively D' (L) and d' (wt %). Note that V' and A' to D' are unknown values. On the other hand, a' to d' respectively correspond to target concentrations of components, which are stored in the storage 72. Thus, a' to d' are already-known values.

Assume that an amount (replenishing amount) and a concentration of acetic acid aqueous solution with which the processing tank 3 is replenished in the concentration adjusting process are $S_A$ (L) and $C_A$ (wt %), respectively. Similarly, assume that a replenishing amount and a concentration of phosphoric acid aqueous solution are $S_B$ (L) and $C_B$ (wt %), respectively, a replenishing amount and a concentration of nitric acid aqueous solution are $S_C$ (L) and $C_C$ (wt %), respectively, and a replenishing amount and a concentration of water are $S_D$ (L) and $C_D$ (wt %), respectively. Note that $S_A$ to $S_D$ are unknown values, and $C_A$ to $C_D$ are already-known values that are preliminarily stored in the storage 72. Note that $C_D$ (wt %) is 100%.

V' (L) of a total amount of etchant after the concentration adjusting process is indicated by the following Formula (5).

$$V'=V+S_A+S_B+S_C+S_D \tag{5}$$

Amounts A' to D' of components included in etchant after the concentration adjusting process are indicated by the following Formulae (6) to (9).

$$A'=\frac{a'}{a'+b'+c'+d'}*\frac{D_G}{D_{PA}}*V'=A+\left(1-D_A*\left(1-\frac{C_A}{100}\right)\right)*S_A \tag{6}$$

$$B'=\frac{b'}{a'+b'+c'+d'}*\frac{D_G}{D_{PB}}*V'=B+\left(1-D_B*\left(1-\frac{C_B}{100}\right)\right)*S_B \tag{7}$$

-continued $$C' = \frac{c'}{a' + b' + c' + d'} * \frac{D_G}{D_{PC}} * V' = C + \left(1 - D_C * \left(1 - \frac{C_C}{100}\right)\right) * S_C \quad (8)$$

$$D' = \frac{d'}{a' + b' + c' + d'} * \frac{D_G}{D_{PD}} * V' = D + S_D + D_A * \left(1 - \frac{C_A}{100}\right) * S_A + D_B * \left(1 - \frac{C_B}{100}\right) * S_B + D_C * \left(1 - \frac{C_C}{100}\right) * S_C \quad (9)$$

Herein, "$D_G$" is a density of etchant after adjustment of concentration. Note that $D_G$ is an already-known value that is stored in the storage 72. In a case where any of target concentrations a' to d' of components is changed, $D_G$ is changed in accordance with the changed a' to d'. Herein, "$D_A$", "$D_B$", "$D_C$", and "$D_D$" are respective densities of acetic acid aqueous solution, phosphoric acid aqueous solution, nitric acid aqueous solution, and water with which the processing tank 3 is replenished. Note that $D_A$, $D_B$, $D_C$, and $D_D$ are already-known values that are stored in the storage 72. Additionally, $D_D$ is equal to $D_{PD}$. In Formulae (6) to (8), $S_A$ to $S_C$ are multiplied by respective coefficients for calculating component amounts in aqueous solutions. A water amount excluded from Formulae (6) to (8) is reflected on Formula (9).

The controller 71 solves simultaneous equations consist of the above-mentioned formulae (6) to (9) so as to calculate a replenishing amount $S_A$ (L) of acetic acid aqueous solution, a replenishing amount $S_B$ (L) of phosphoric acid aqueous solution, a replenishing amount $S_C$ (L) of nitric acid aqueous solution, and a replenishing amount $S_D$ (L) of water.

As described above, the controller 71 is capable of deciding replenishing amounts $S_A$ to $S_D$ of components (aqueous solution in a case of acetic acid, phosphoric acid, and nitric acid) in the concentration adjusting process on the basis of measurement result (namely, V and a to d) of the liquid level sensor 35 and the concentration sensor 33*f*.

Next, the controller 71 replenishes the processing tank 3 with acetic acid aqueous solution, phosphoric acid aqueous solution, nitric acid aqueous solution, and water having decided replenishing amounts (Step S104). Specifically, the controller 71 opens the first open/close valve 85*d* and the second open/close valve 85*h* of the second acetic acid supplying unit 85 so as to start to replenish the outer tank 32 of the processing tank 3 with acetic acid aqueous solution from the second acetic acid supplying unit 85.

Herein, as described above, etchant according to the embodiment includes equal to or more than 50% of acetic acid. Thus, an amount of acetic acid aqueous solution for replenishment in the concentration adjusting process is more than amounts of other components. On the contrary, in the substrate processing apparatus 1 according to the embodiment, replenishment with acetic acid aqueous solution is executed by using acetic acid aqueous solution whose flow volume is larger than that of the first acetic acid supply unit 81, so that it is possible to shorten a time interval needed for replenishment of acetic acid aqueous solution, thereby leading to shortening a time interval needed for the concentration adjusting process.

The controller 71 opens the first open/close valve 85*d* and the second open/close valve 85*h* of the second acetic acid supplying unit 85 so as to start to replenish the outer tank 32 of the processing tank 3 with acetic acid aqueous solution from the second acetic acid supplying unit 85. In a case where determining, on the basis of the measurement result of the liquid level sensor 35, that a liquid surface of the outer tank 32 rises by a distance according to a replenishing amount $S_A$ decided in Step S103, the controller 71 closes the first open/close valve 85*d* and the second open/close valve 85*h* so as to stop replenishing the processing tank 3 with acetic acid aqueous solution.

The second acetic acid supplying unit 85 is provided with the constant-pressure valve 85*f*, and a flow volume of acetic acid aqueous solution flowing through the supply route 85*b* is limited to a constant flow volume. The controller 71 controls the flow volume adjusting valve 85*g* on the basis of a flow volume of acetic acid aqueous solution, which is measured by the flowmeter 85*e*, so as to adjust a flow volume of acetic acid aqueous solution flowing through the supply route 85*b* to a preliminarily-set flow volume. Thus, the substrate processing apparatus 1 is capable of appropriately controlling an input amount of acetic acid aqueous solution in the concentration adjusting process.

Herein, a case is exemplified in which acetic acid aqueous solution is supplied from the second acetic acid supplying unit 85; however, the controller 71 may supply acetic acid aqueous solution from the first acetic acid supply unit 81. Moreover, the controller 71 may supply acetic acid aqueous solution from both of the first acetic acid supply unit 81 and the second acetic acid supplying unit 85.

The controller 71 controls the constant volume pump 82*d* of the phosphoric acid supplying unit 82 so as to supply phosphoric acid aqueous solution having a replenishing amount $S_B$, which is decided in Step S103, from the phosphoric acid supplying unit 82 to the outer tank 32. The controller 71 controls the constant volume pump 83*d* of the nitric acid supplying unit 83 so as to supply nitric acid aqueous solution having a replenishing amount $S_C$, which is decided in Step S103, from the nitric acid supplying unit 83 to the outer tank 32. The controller 71 controls the constant volume pump 84*d* of the water supplying unit 84 so as to supply water having a replenishing amount $S_D$, which is decided in Step S103, from the water supplying unit 84 to the outer tank 32.

As described above, the controller 71 controls the supply unit 5 so as to replenish the processing tank 3 with acetic acid aqueous solution, phosphoric acid aqueous solution, nitric acid aqueous solution, and water having respective replenishing amount $S_A$ to $S_D$, which are decided in Step S103, from the supply unit 5. Thus, it is possible to retain the processing tank 3 with etchant in which concentrations of components are adjusted to respective target concentrations a' to d'.

In a case where finishing a process of Step S104, or determining that a moisture concentration is equal to a target concentration in Step S102 (Step S102: Yes), the controller 71 shifts the processing to an etching process (Step S105).

Next, a detailed procedure of the discharging and replenishing process will be explained with reference to FIG. 8. FIG. 8 is a flowchart illustrating a procedure for the discharging and replenishing process.

Figure 8:
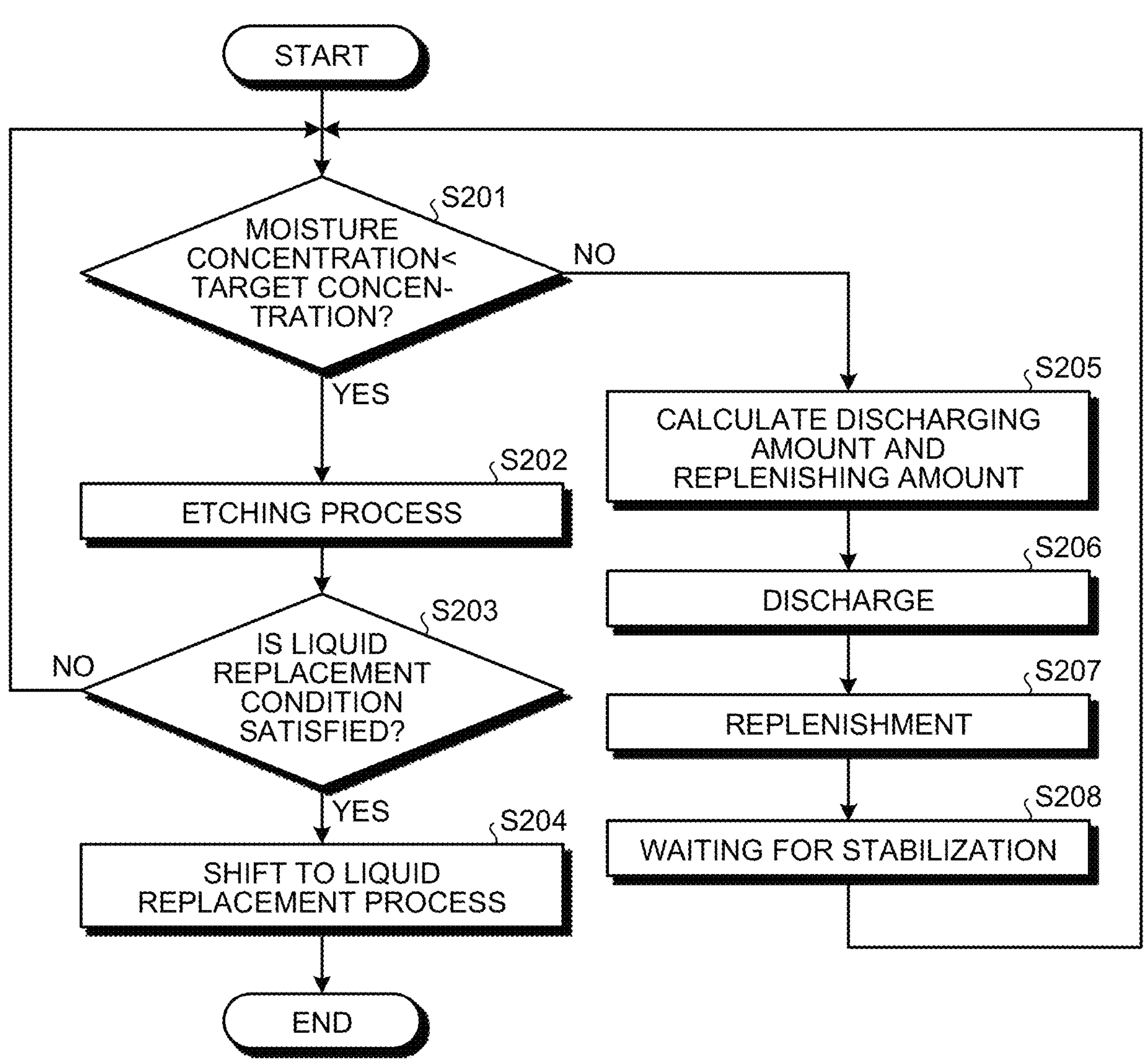
FIG. 8 is a flowchart illustrating a procedure for the discharging and replenishing process according to the embodiment.

As illustrated in FIG. 8, prior to an etching process, the controller 71 determines whether or not a moisture concentration of etchant, with which the processing tank 3 is retained, is less than a threshold (Step S201). Specifically, on the basis of a signal transmitted from the concentration sensor 33*f*, the controller 71 acquires a moisture concentration of etchant with which the processing tank 3 is retained. The controller 71 compares the acquired moisture concentration and a threshold stored in the storage 72 with each other so as to determine whether or not a moisture concentration is less than a threshold.

In Step S201, in a case where determining that a moisture concentration is less than the threshold (Step S201: Yes), the controller 71 executes an etching process (Step S202).

Specifically, the controller 71 holds the plurality of wafers W by using the holding unit 4, and then moves the holding unit 4 to a processing position by using a not-illustrated turn/lift mechanism so as to dip the plurality of wafers W held by the holding unit 4 in etchant with which the processing tank 3 is retained. Next, the controller 71 moves the holding unit 4 to a retreat position by using a not-illustrated turn/lift mechanism, and then transfers the plurality of wafers W to a processing tank for a rinsing process included in the substrate processing apparatus 1.

After finishing the etching process, the controller 71 determines whether or not a liquid replacement condition is satisfied (Step S203). The liquid replacement condition can be arbitrarily set. For example, the liquid replacement condition may be the number of the wafers W on which an etching process is executed after the last liquid replacement process, or may be an elapsed time interval from the last liquid replacement process.

In a case where the liquid replacement condition is not satisfied in Step S203 (Step S203: No), the controller 71 returns the processing to Step S201. On the other hand, in a case where determining that the liquid replacement condition is satisfied (Step S203: Yes), the controller 71 shifts the processing to the liquid replacement process (Step S204). In other words, the controller 71 shifts the processing to the process of Step S101 illustrated in FIG. 7.

On the other hand, in a case where a moisture concentration is not less than the threshold in Step S201 (Step S201: No), in other words, in a case where a moisture concentration exceeds the threshold, the controller 71 shifts the processing to Step S205 (Step S205). In Step S205, the controller 71 calculates a discharging amount and a replenishing amount.

Herein, assume that a total amount of etchant at a time point when a moisture concentration is determined to exceed a threshold is V" (L). Note that V" can be acquired from measurement result of the liquid level sensor 35. Furthermore, assume that an acetic acid concentration and an acetic acid amount of etchant at a time point when a moisture concentration is determined to exceed a threshold are respectively a" (wt %) and A" (L). Similarly, assume that a phosphoric acid concentration and a phosphoric acid amount of etchant at a time point when a moisture concentration is determined to exceed a threshold are respectively b" (wt %) and B" (L), a nitric acid concentration and a nitric acid amount of etchant at a time point when a moisture concentration is determined to exceed a threshold are respectively c" (wt %) and C" (L), and a moisture concentration and a water amount of etchant at a time point when a moisture concentration is determined to exceed a threshold are respectively d" (wt %) and D" (L). Herein, a" to d" can be acquired from measurement result of the concentration sensor **33*f***. Additionally, A" to D" can be calculated by using V" and a" to d".

Assume that an amount (discharging amount) of etchant discharged from the processing tank 3 is $V_{PD}$. $V_{PD}$ is an unknown value. Assume that a total amount of etchant after the discharging and replenishing process is $V_0$. $V_0$ is a set value that is preliminarily stored in the storage 72, in other words, is an already-known value. Assume that an acetic acid concentration, a phosphoric acid concentration, a nitric acid concentration, and a moisture concentration of etchant after the discharging and replenishing process are respectively $a_0$ (wt %), $b_0$ (wt %), $c_0$ (wt %), and do (wt %). Note that $a_0$ to $d_0$ are set values that are stored in the storage 72 as target concentrations, in other words, are already-known values. In other words, $a_0$ to do are values that are respectively equal to a' to d'. Assume that an acetic acid amount, a phosphoric acid amount, a nitric acid amount, and a water amount of etchant after the discharging and replenishing process are respectively $A_0$ (L), $B_0$ (L), $C_0$ (L), and $D_0$ (L). Note that $A_0$ to $D_0$ can be calculated from $V_0$ and $a_0$ to $d_0$.

Assume that a replenishing amount of etchant from the etchant supplying unit 6 to the processing tank 3 in the discharging and replenishing process is $S_{GE}$ (L). Assume that replenishing amounts of acetic acid aqueous solution, phosphoric acid aqueous solution, nitric acid aqueous solution, and water from the individual supply unit 8 to the processing tank 3 in the discharging and replenishing process are respectively $S'_A$ (L), $S'_B$ (L), $S'_C$ (L), and $S'_D$ (L). Note that $S_{GE}$, $S'_A$, $S'_B$, $S'_C$, and $S'_D$ are unknown values.

A total amount $V_0$ of etchant after the discharging and replenishing process can be indicated by the following Formula (10).

$$V_0 = V'' - V_{PD} + S_{GE} + S'_A + S'_B + S'_C + S'_D \tag{10}$$

An acetic acid amount $A_0$, a phosphoric acid amount $B_0$ (L), a nitric acid amount $C_0$ (L), and a water amount $D_0$ (L) of etchant after the discharging and replenishing process can be indicated by the following Formulae (11) to (14).

$$A_0 = A''\left(1 - \frac{V_{PD}}{V''}\right) + \frac{C_{GA}}{100} * \frac{D_G}{D_{PA}} * S_{GE} + \left(1 - D_A * \left(1 - \frac{C_A}{100}\right)\right) * S'_A \tag{11}$$

$$B_0 = B''\left(1 - \frac{V_{PD}}{V''}\right) + \frac{C_{GB}}{100} * \frac{D_G}{D_{PB}} * S_{GE} + \left(1 - D_B * \left(1 - \frac{C_B}{100}\right)\right) * S'_B \tag{12}$$

$$C_0 = C''\left(1 - \frac{V_{PD}}{V''}\right) + \frac{C_{GC}}{100} * \frac{D_G}{D_{PC}} * S_{GE} + \left(1 - D_C * \left(1 - \frac{C_C}{100}\right)\right) * S'_C \tag{13}$$

$$D_0 = D''\left(1 - \frac{V_{PD}}{V''}\right) + \frac{C_{GD}}{100} * \frac{D_G}{D_{PC}} * S_{GE} + \left(1 - D_d * \left(1 - \frac{C_D}{100}\right)\right) * S'_D + D_A * \left(1 - \frac{C_A}{100}\right) * S'_A + D_B * \left(1 - \frac{C_B}{100}\right) * S'_B + D_C * \left(1 - \frac{C_C}{100}\right) * S'_C \tag{14}$$

Herein, "$C_{GA}$", "$C_{GB}$", "$C_{GC}$", and "$C_{GD}$" are respectively an acetic acid concentration, a phosphoric acid concentration, a nitric acid concentration, and a moisture concentration of etchant supplied from the etchant supplying unit 6. Note that $C_{GA}$, $C_{GB}$, $C_{Gc}$, and $C_{GD}$ are set values that are preliminarily stored in the storage 72, in other words, already-known values. The moisture concentration $C_{GD}$ corresponds to an "initial concentration" illustrated in FIG. 6.

In the discharging and replenishing process mainly for reducing a moisture concentration, water is not supplied from the water supplying unit 84 to the processing tank 3. Thus, a replenishing amount $S'_D$ of water from the water supplying unit 84 to the processing tank 3 in the discharging and replenishing process can be indicated by the following Formula (15).

$$S'_D = 0 \tag{15}$$

The controller 71 solves simultaneous equations consist of Formulae (11) to (15) so as to calculate $V_{PD}$, $S_{GE}$, $S'_A$, $S'_B$, and $S'_C$ that are unknown values. In other words, the controller 71 calculates a discharging amount $V_{PD}$ (L) of etchant in the discharging and replenishing process. The controller 71 calculates a replenishing amount $S_{GE}$ (L) of etchant, a replenishing amount $S'_A$ (L) of acetic acid aqueous solution, a replenishing amount $S'_B$ (L) of phosphoric acid aqueous solution, and a replenishing amount $S'_C$ (L) of a replenishing amount $S'_C$ (L) in the discharging and replenishing process.

As described above, in the discharging and replenishing process, the controller 71 decides a discharging amount $V_{PD}$ of etchant delivered from the processing tank 3 and replenishing amounts of acetic acid, phosphoric acid, and nitric acid for the processing tank 3 (namely, $S_{GE}$, $S'_A$, $S'_B$, and $S'_C$) on the basis of concentrations a" to d" of components measured by the concentration sensor 33*f*, an amount V" of etchant measured by the liquid level sensor 35, a preliminarily-set target amount $V_0$ of etchant, and preliminarily-set target concentrations $a_0$ to $d_0$ of components.

Next, the controller 71 executes a process for discharging the decided discharging amount of etchant from the processing tank 3 (Step S206). Specifically, the controller 71 opens the open/close valve 34*b* of the drainage unit 34 so as to start to discharge etchant from the processing tank 3. Next, in a case where determining that a liquid surface of the outer tank 32 is reduced by a distance according to a discharging amount $V_{PD}$ decided in Step S205, on the basis of measurement result of the liquid level sensor 35, the controller 71 closes the open/close valve 34*b* so as to stop discharging etchant from the processing tank 3.

As described above, in the substrate processing apparatus 1, the liquid discharging passage 34*a* is provided with the flow volume adjusting valve 34*c* so as to reduce a drainage speed. Thus, it is possible to control a discharging amount of etchant from the processing tank 3 with high accuracy.

Next, the controller 71 executes a process for replenishing the processing tank 3 with acetic acid, phosphoric acid, and nitric acid (Step S207).

For example, the controller 71 opens the first open/close valve 6*d* and the second open/close valve 6*h* of the etchant supplying unit 6 so as to replenish the outer tank 32 of the processing tank 3 with etchant from the etchant supplying unit 6. In a case where determining that a liquid surface of the outer tank 32 rises by a distance according to a replenishing amount $S_{GE}$ that is decided in Step S205, on the basis of measurement result of the liquid level sensor 35, the controller 71 closes the first open/close valve 6*d* and the second open/close valve 6*h* so as to stop replenishing the processing tank 3 with etchant.

The etchant supplying unit 6 is provided with the constant-pressure valve 6*f*, and a flow volume of etchant flowing through the supply route 6*b* is limited to a constant flow volume. Moreover, in the liquid replacement process, the controller 71 controls the flow volume adjusting valve 6*g* on the basis of a flow volume of etchant, which is measured by the flow meter 6*e*, so as to adjust a flow volume of etchant flowing through the supply route 6*b* to a preliminarily-set flow volume. Thus, the substrate processing apparatus 1 is capable of appropriately controlling an input amount of etchant in the liquid replacement process.

Next, the controller 71 opens the first open/close valve 85*d* and the second open/close valve 85*h* of the second acetic acid supplying unit 85 so as to start to replenish the processing tank 3 with acetic acid aqueous solution from the second acetic acid supplying unit 85 to the outer tank 32. In a case where determining, on the basis of measurement result of the liquid level sensor 35, that a liquid surface of the outer tank 32 rises by a distance according to a replenishing amount $S'_A$ that is decided in Step S205, the controller 71 closes the first open/close valve 85*d* and the second open/close valve 85*h* so as to stop replenishing the processing tank 3 with acetic acid aqueous solution.

The second acetic acid supplying unit 85 is provided with the constant-pressure valve 85*f*, and a flow volume of acetic acid aqueous solution flowing through the supply route 85*b* is limited to a constant low volume. The controller 71 controls the flow volume adjusting valve 85*g* on the basis of a flow volume of acetic acid aqueous solution, which is measured by the flowmeter 85*e*, so as to adjust a flow volume of acetic acid aqueous solution flowing through the supply route 85*b* to a preliminarily-set flow volume. Thus, the substrate processing apparatus 1 is capable of appropriately controlling a replenishing amount $S'_A$ of acetic acid aqueous solution.

Herein, a case is exemplified in which acetic acid aqueous solution is supplied from the second acetic acid supplying unit 85; however, the controller 71 may supply acetic acid aqueous solution from the first acetic acid supply unit 81. The controller 71 may supply acetic acid aqueous solution from both of the first acetic acid supply unit 81 and the second acetic acid supplying unit 85.

The controller 71 controls the constant volume pump 82*d* of the phosphoric acid supplying unit 82 so as to supply phosphoric acid aqueous solution having a replenishing amount S' decided in Step S205 from the phosphoric acid supplying unit 82 to the outer tank 32. The controller 71 controls the constant volume pump 83*d* of the nitric acid supplying unit 83 so as to supply nitric acid aqueous solution having a replenishing amount $S'_C$ decided in Step S205 from the nitric acid supplying unit 83 to the outer tank 32.

As described above, the controller 71 controls the supply unit 5 so as to supply acetic acid, phosphoric acid, and nitric acid having replenishing amounts $S_{GE}$, $S'_A$ to $S'_D$, which are decided in Step S205, from the supply unit 5 to the processing tank 3. Thus, it is possible to readjust concentrations of components to target concentrations $a_0$ to $d_0$. In other words, it is possible to reduce a moisture concentration having risen over time to a target concentration.

After completion of the process of Step S207, the controller 71 waits for a preliminarily-set time interval in order to stabilize a concentration of etchant (Step S208). In Step S208, the controller 71 causes the circulation unit 33 to circulate etchant. Thus, etchant is stirred to stabilize a concentration thereof. After completion of the process of Step S208, the controller 71 shifts the processing to Step S201.

As described above, a substrate processing apparatus (for one example, substrate processing apparatus 1) according to the embodiment etches a molybdenum film (for one example, molybdenum film 11) of a substrate (for one example, wafer W) having a device structure that includes, in a multistage manner, multilayer films including the molybdenum film. The substrate processing apparatus includes a processing tank (for one example, processing tank 3), a supply unit (for one example, supply unit 5), an open/close valve (for one example, open/close valve 34*b*), a concentration measuring unit (for one example, concentration sensor 33*f*), a liquid amount measuring unit (for one example, liquid level sensor 35), and a controller (for one example, controller 71). The processing tank retains therein etchant including acetic acid, phosphoric acid, nitric acid, and water as components. The supply unit supplies acetic acid, phosphoric acid, nitric acid, and water individually or as the etchant to the processing tank. The open/close valve opens/closes a liquid discharging passage (for one example, liquid discharging passage 34*a*) of the processing tank. The concentration measuring unit measures a concentration for each of the components of the etchant retained in the processing tank. The liquid amount measuring unit measures an amount of the etchant retained in the processing tank. The controller that controls the open/close valve and the supply unit to execute a discharging and replenishing process including: discharging a part of the etchant from the processing tank; and replenishing the processing tank with acetic acid, phosphoric acid, and nitric acid. In the discharging and replenishing process, the controller is configured to: based on concentrations of the respective components measured by the concentration measuring unit, an amount of the etchant measured by the liquid amount measuring unit, a preliminarily-set target amount of the etchant, and preliminarily-set target concentrations of the respective components; decide a discharging amount of the etchant from the processing tank, and replenishing amounts of acetic acid, phosphoric acid, and nitric acid to the processing tank; control the open/close valve to discharge the decided discharging amount of the etchant from the processing tank; and control the supply unit to replenish the processing tank with the decided replenishing amounts of acetic acid, phosphoric acid, and nitric acid.

Thus, it is possible to reduce a rise in a moisture concentration of etchant over time. As described above, a rise in a moisture concentration is reduced, and thus a rise in an etching rate of etchant with respect to a molybdenum film is reduced, so that the substrate processing apparatus according to the embodiment is capable of stably etching the molybdenum film formed on a substrate.

The controller may be further configured to: in a case where a moisture concentration measured by the concentration measuring unit exceeds a threshold, execute the discharging and replenishing process. Thus, it is possible to appropriately manage a moisture concentration of etchant. In other words, it is possible to appropriately reduce a rise in an etching rate of etchant with respect to a molybdenum film.

The controller may be further configured to: control the supply unit to execute: a liquid replacement process for supplying the etchant whose moisture concentration is lower than the target concentration to the vacant processing tank; and a concentration adjusting process for adjusting a concentration of the etchant after the liquid replacement process. In this case, in the concentration adjusting process, the controller may be further configured to: based on concentrations of the respective components measured by the concentration measuring unit, an amount of the etchant measured by the liquid amount measuring unit, a target amount of the etchant, and target concentrations of the respective components; decide replenishing amounts of acetic acid, phosphoric acid, nitric acid, and water to the processing tank; and control the supply unit to supply the decided replenishing amounts of acetic acid, phosphoric acid, nitric acid, and water to the processing tank.

Thus, it is possible to adjust concentrations of components in etchant after the liquid replacement process to target concentrations.

The supply unit may include: an individual supply unit that individually supplies acetic acid, phosphoric acid, nitric acid, and water to the processing tank; and an etchant supplying unit that supplies the etchant to the processing tank. In this case, the individual supply unit may include: a first acetic acid supply unit that supplies acetic acid at a first flow volume; and a second acetic acid supplying unit that supplies acetic acid at a second flow volume that is larger than the first flow volume.

Thus, it is possible to prevent a case where a time interval needed for replenishment of acetic acid becomes a bottleneck of a processing time interval in the discharging and replenishing process. In other words, it is possible to shorten a time interval needed for the discharging and replenishing process.

The second acetic acid supplying unit may include a flow volume adjusting valve. Thus, it is possible to appropriately control a replenishing amount of acetic acid.

The etchant supplying unit may include a flow volume adjusting valve. Thus, it is possible to appropriately control a replenishing amount of etchant.

The supply unit may include a temperature regulating unit that adjusts temperatures of acetic acid, phosphoric acid, nitric acid, and water. In this case, the controller may be further configured to: control the temperature regulating unit to adjust temperatures of acetic acid, phosphoric acid, nitric acid, and water to equal to or more than 10° C. and equal to or less than 40° C.

Thus, it is possible to reduce a case where an etching rate of etchant with respect to a molybdenum film becomes excessively high. Moreover, it is further possible to prevent acetic acid from freezing.

It should be considered that embodiments as disclosed herein are not limitative but are illustrative in any aspect. Indeed, the embodiments as described above can be implemented in various forms thereof. Furthermore, the embodiments as described above may be omitted, substituted, or modified in various forms thereof, without departing from the appended claims and the spirit thereof.

The invention claimed is:

1. A substrate processing apparatus to etch a molybdenum film of a substrate having a device structure that includes, in a multistage manner, multilayer films including the molybdenum film, the apparatus comprising:

- a processing tank that retains therein etchant including acetic acid, phosphoric acid, nitric acid, and water as components;
- a supply unit that supplies acetic acid, phosphoric acid, nitric acid, and water individually or as the etchant to the processing tank;
- an open/close valve that opens/closes a liquid discharging passage of the processing tank;
- a concentration measuring unit that measures a concentration for each of the components of the etchant retained in the processing tank;
- a liquid amount measuring unit that measures an amount of the etchant retained in the processing tank; and
- a controller that controls the open/close valve and the supply unit to execute a discharging and replenishing process including:
  - discharging a part of the etchant from the processing tank; and
  - replenishing the processing tank with acetic acid, phosphoric acid, and nitric acid, wherein
- in the discharging and replenishing process, the controller is configured to:
  - based on concentrations of the respective components measured by the concentration measuring unit, an amount of the etchant measured by the liquid amount measuring unit, a preliminarily-set target amount of the etchant, and preliminarily-set target concentrations of the respective components; decide a discharging amount of the etchant from the processing tank, and replenishing amounts of acetic acid, phosphoric acid, and nitric acid to the processing tank;

control the open/close valve to discharge the decided discharging amount of the etchant from the processing tank; and control the supply unit to replenish the processing tank with the decided replenishing amounts of acetic acid, phosphoric acid, and nitric acid.

2. The substrate processing apparatus according to claim 1, wherein the controller is further configured to:

in a case where a moisture concentration measured by the concentration measuring unit exceeds a threshold, execute the discharging and replenishing process.

3. The substrate processing apparatus according to claim 1, wherein the controller is further configured to:

control the supply unit to execute:

a liquid replacement process for supplying the etchant whose moisture concentration is lower than the target concentration to the processing tank; and a concentration adjusting process for adjusting a concentration of the etchant after the liquid replacement process, and in the concentration adjusting process, the controller is further configured to:

based on concentrations of the respective components measured by the concentration measuring unit, an amount of the etchant measured by the liquid amount measuring unit, a target amount of the etchant, and target concentrations of the respective components; decide replenishing amounts of acetic acid, phosphoric acid, nitric acid, and water to the processing tank; and control the supply unit to supply the decided replenishing amounts of acetic acid, phosphoric acid, nitric acid, and water to the processing tank.

4. The substrate processing apparatus according to claim 1, wherein the supply unit includes:

an individual supply unit that individually supplies acetic acid, phosphoric acid, nitric acid, and water to the processing tank; and an etchant supplying unit that supplies the etchant to the processing tank, and the individual supply unit includes:

a first acetic acid supply unit that supplies acetic acid at a first flow volume; and a second acetic acid supplying unit that supplies acetic acid at a second flow volume that is larger than the first flow volume.

5. The substrate processing apparatus according to claim 4, wherein the second acetic acid supplying unit includes a flow volume adjusting valve.

6. The substrate processing apparatus according to claim 4, wherein the etchant supplying unit includes a flow volume adjusting valve.

7. The substrate processing apparatus according to claim 1, wherein the supply unit includes a temperature regulating unit that adjusts temperatures of acetic acid, phosphoric acid, nitric acid, and water, and the controller is further configured to:

control the temperature regulating unit to adjust temperatures of acetic acid, phosphoric acid, nitric acid, and water to equal to or more than 10° C. and equal to or less than 40° C.

8. A substrate processing method for etching a molybdenum film of a substrate having a device structure that includes, in a multistage manner, multilayer films including the molybdenum film, the method comprising:

measuring concentrations of respective components in etchant retained in a processing tank, the etchant including acetic acid, phosphoric acid, nitric acid, and water as the components;

measuring an amount of the etchant retained in the processing tank;

discharging a part of the etchant from the processing tank; and executing a discharging and replenishing process for replenishing the processing tank with acetic acid, phosphoric acid, and nitric acid, wherein the executing the discharging and replenishing process includes:

based on concentrations of the respective components measured in the measuring concentrations, an amount of the etchant measured in the measuring an amount of the etchant, a preliminarily-set target amount of the etchant, and preliminarily-set target concentrations of the respective components; deciding a discharging amount of the etchant from the processing tank and replenishing amounts of acetic acid, phosphoric acid, and nitric acid to the processing tank;

discharging the decided discharging amount of the etchant from the processing tank; and supplying the decided replenishing amounts of acetic acid, phosphoric acid, and nitric acid to the processing tank.

* * * * *